United States Patent
Remboski et al.

(10) Patent No.: US 12,414,275 B2
(45) Date of Patent: Sep. 9, 2025

(54) MULTI-PURPOSE TRACTION INVERTER BUS BAR SYSTEM

(71) Applicant: Neapco Intellectual Property Holdings, LLC, Farmington Hills, MI (US)

(72) Inventors: Donald James Remboski, Ann Arbor, MI (US); Patrick A. O'Gorman, Escondido, CA (US); Gorazd Gotovac, Ljubljana (SI)

(73) Assignee: Neapco Intellectual Property Holdings, LLC

( * ) Notice: Subject to any disclaimer, the term of this patent is extended or adjusted under 35 U.S.C. 154(b) by 391 days.

(21) Appl. No.: 17/977,482

(22) Filed: Oct. 31, 2022

(65) Prior Publication Data
US 2023/0140795 A1    May 4, 2023

Related U.S. Application Data

(60) Provisional application No. 63/274,154, filed on Nov. 1, 2021.

(51) Int. Cl.
*H05K 7/20* (2006.01)
*H02K 9/19* (2006.01)

(52) U.S. Cl.
CPC ........... *H05K 7/20927* (2013.01); *H02K 9/19* (2013.01); *H05K 7/20272* (2013.01); *H05K 7/209* (2013.01)

(58) Field of Classification Search
CPC ...... H02K 1/20; H02K 11/33; H02K 11/0094; H02K 11/25; H02M 7/003; H02M 7/5387; H05K 7/14322; H05K 7/209; H05K 7/20927; H05K 7/1432
See application file for complete search history.

(56) References Cited

U.S. PATENT DOCUMENTS

| | | | |
|---|---|---|---|
| 2020/0006197 A1* | 1/2020 | Hart | H01L 23/36 |
| 2021/0135538 A1 | 5/2021 | Remboski et al. | |
| 2021/0313862 A1* | 10/2021 | Franck | H02K 5/203 |

FOREIGN PATENT DOCUMENTS

JP    4539531 B2    9/2010

* cited by examiner

*Primary Examiner* — Bryan R Perez
(74) *Attorney, Agent, or Firm* — Dickinson Wright PLLC

(57) ABSTRACT

A common lubrication and cooling system includes a lubricant-supported electric motor including a stator and a rotor defining a gap therebetween, with a liquid coolant disposed in the gap for supporting the rotor while allowing the rotor to rotate relative to the stator. The common lubrication and cooling system also includes a liquid-cooled inverter. The liquid-cooled inverter includes a plurality of switch devices configured to supply an alternating current (AC) power to the lubricant-supported electric motor for driving the rotor to rotate. The liquid-cooled inverter also includes a first heatsink mechanically connected to the plurality of switch devices. The liquid-cooled inverter also includes an inverter passageway configured transmit the liquid coolant between the lubricant-supported electric motor and into fluid communication with the first heatsink for transmitting heat away from the first heatsink.

18 Claims, 5 Drawing Sheets

MULTI-PURPOSE TRACTION INVERTER BUS BAR SYSTEM

CROSS-REFERENCE TO RELATED APPLICATIONS

This utility application claims the benefit of U.S. Provisional Application No. 63/274,154 filed Nov. 1, 2021. The entire disclosure of the above application is incorporated herein by reference.

FIELD OF THE DISCLOSURE

The present disclosure relates generally to a lubricant-supported electric motor and a liquid-cooled inverter. More specifically, the present disclosure relates to a multi-purpose traction inverter bus bar system used in association with a liquid-cooled inverter that allows the liquid-cooled inverter and the lubricant-supported electric motor to share a common lubricant/coolant fluid.

BACKGROUND OF THE INVENTION

This section provides a general summary of background information and the comments and examples provided in this section are not necessarily prior art to the present disclosure.

Various drivelines in automotive, truck and certain off-highway applications take power from a central prime mover and distribute the power to the wheels using mechanical devices such as transmissions, transaxles, propeller shafts, and live axles. These configurations work well when the prime mover can be bulky or heavy, such as, for example, various internal combustion engines ("ICE"). However, more attention is being directed towards alternative arrangements of prime movers that provide improved environmental performance, eliminate mechanical driveline components, and result in a lighter-weight vehicle with more space for passengers and payload.

"On wheel", "in-wheel" or "near-wheel" motor configurations are one alternative arrangement for the traditional ICE prime mover that distributes the prime mover function to each or some of the plurality of wheels via one or more motors disposed on, within, or proximate to the plurality of wheels. For example, in one instance, a traction motor, using a central shaft though a rotor and rolling element bearings to support the rotor, can be utilized as the "on wheel", "in wheel" or "near wheel" motor configuration. In another instance, a lubricant-supported electric motor can be utilized as the "on wheel", "in wheel" or "near wheel" motor configuration. While each of these motor configurations result in a smaller size and lighter weight arrangement as compared to the prime movers based on the internal combustion engine, they each have certain drawbacks and disadvantages.

One aspect of electric drive motors that adds to their cost and complexity is the requirement for a variety of fluids used for different functions of the electric drive motor and associated systems. For example, a wheel end electric system often includes a water-glycol cooling fluid for the electric motor and separate cooling fluids for other components (e.g., the liquid-cooled inverter) of the electric drive system. Each of these fluids require separate storage compartments and distribution channels, as well as systems for distributing or cycling the fluids to the desired locations within the systems. In the water-glycol cooled traction motors, the cooling fluid also does not touch the moving motor parts, such as the bearing surfaces, and thus cannot cool these components and is unable to support the rotor relative to the stator, such as is the case with lubricant-supported electric motors. In addition, fluid passages defined by the electric motor are not narrow enough to block the flow of the coolant.

Additionally, water-based coolants must be separated from hydrocarbon lubricated surfaces and from high voltage and low voltage electronics. A water-glycol based coolant coming into contact with electronics can lead to electrical shorts and substantial damage to the electrical components. Thus, using water-glycol coolants to cool electronics requires the use of heat exchangers, which are themselves costly, bulky and heavy. Accordingly, most inverters require that the electronic components are separated by an aluminum plate from the coolant fluid, so that the fluid is never in contact with the power components. Put another way, prior art liquid-cooled inverters mount the devices to an aluminum plate (via a thin insulator) which is in contact with the fluid. If the water-glycol is the cooling fluid, the aluminum plate is grounded. If oil is the cooling fluid, the aluminum plate can be isolated from ground, but an additional cost is required because of the relatively high mass of the aluminum plate and power devices. As a result, the heatsink is usually grounded because of the mounting design.

For these reasons, the present solutions to the problem of cooling liquid-cooled inverters with oil results in the use of a $2^{nd}$ fluid (water-glycol) or an expensive mechanical design. Neither one of these solutions is advantageous as it leads to increased costs due to additional parts or cooling systems. Also, in most of the prior art applications, over-heating of the dc link capacitor is a major design difficulty because the outside surface of the package is not easily cooled. Thus, there remains a continuing need for improved systems to allow a shared cooling to be used for both a lubricant-supported electric motor as well as to a liquid-cooled inverter.

SUMMARY OF THE INVENTION

The present disclosure provides a common lubrication and cooling system. The common lubrication and cooling system includes a lubricant-supported electric motor including a stator and a rotor defining a gap therebetween, with a liquid coolant disposed in the gap for supporting the rotor while allowing the rotor to rotate relative to the stator. The common lubrication and cooling system also includes a liquid-cooled inverter. The liquid-cooled inverter includes a plurality of switch devices configured to supply an alternating current (AC) power to the lubricant-supported electric motor for driving the rotor to rotate. The liquid-cooled inverter also includes a first heatsink mechanically connected to the plurality of switch devices. The liquid-cooled inverter also includes an inverter passageway configured transmit the liquid coolant between the lubricant-supported electric motor and into fluid communication with the first heatsink for transmitting heat away from the first heatsink.

The present disclosure also provides a liquid-cooled inverter. The liquid-cooled inverter includes a direct current (DC) positive conductor and a DC negative conductor configured to have a DC voltage therebetween. The liquid-cooled inverter also includes a phase driver. The phase driver includes a printed circuit board (PCB), a high-side power switch configured to selectively conduct power between the DC positive conductor and an output conductor, and a low-side power switch configured to selectively conduct power between the DC negative conductor and the output conductor. At least one of the high-side power switch and the low-side power switch includes a plurality of switch devices disposed on the PCB. The liquid-cooled inverter also includes a first heatsink mechanically connected to the plurality of switch devices and configured to remove heat therefrom. The liquid-cooled inverter also includes a housing defining an inverter passageway configured to conduct a liquid coolant in thermal communication with the first heatsink for removing heat therefrom.

BRIEF DESCRIPTION OF THE DRAWINGS

The drawings described herein are for illustrative purposes only of selected embodiments and not all possible implementations, and are not intended to limit the scope of the present disclosure.

DETAILED DESCRIPTION OF THE ENABLING EMBODIMENTS

The present disclosure is generally directed to a lubricant-supported electric motor and an electric component, namely a liquid-cooled inverter, having a shared lubricating and cooling system. More specifically, the system uses a common lubricant/coolant fluid, such as a dielectric oil, that is both disposed within a lubricant-supported electric motor to lubricant the electric motor and support the rotor relative to the stator, while also being used to cool electronic modules of the liquid-cooled inverter. Put another way, the lubricant-supported electric motor and the liquid-cooled inverter use the same liquid coolant. Oil is a very good liquid coolant to use for cooling high voltage components because of the oil's insulating properties. The oil may also help to minimize electromagnetic interference (EMI) by spacing apart current carrying devices from grounded conductors. Other advantages will be appreciated in view of the following more detailed description of the subject invention.

Figure 1:
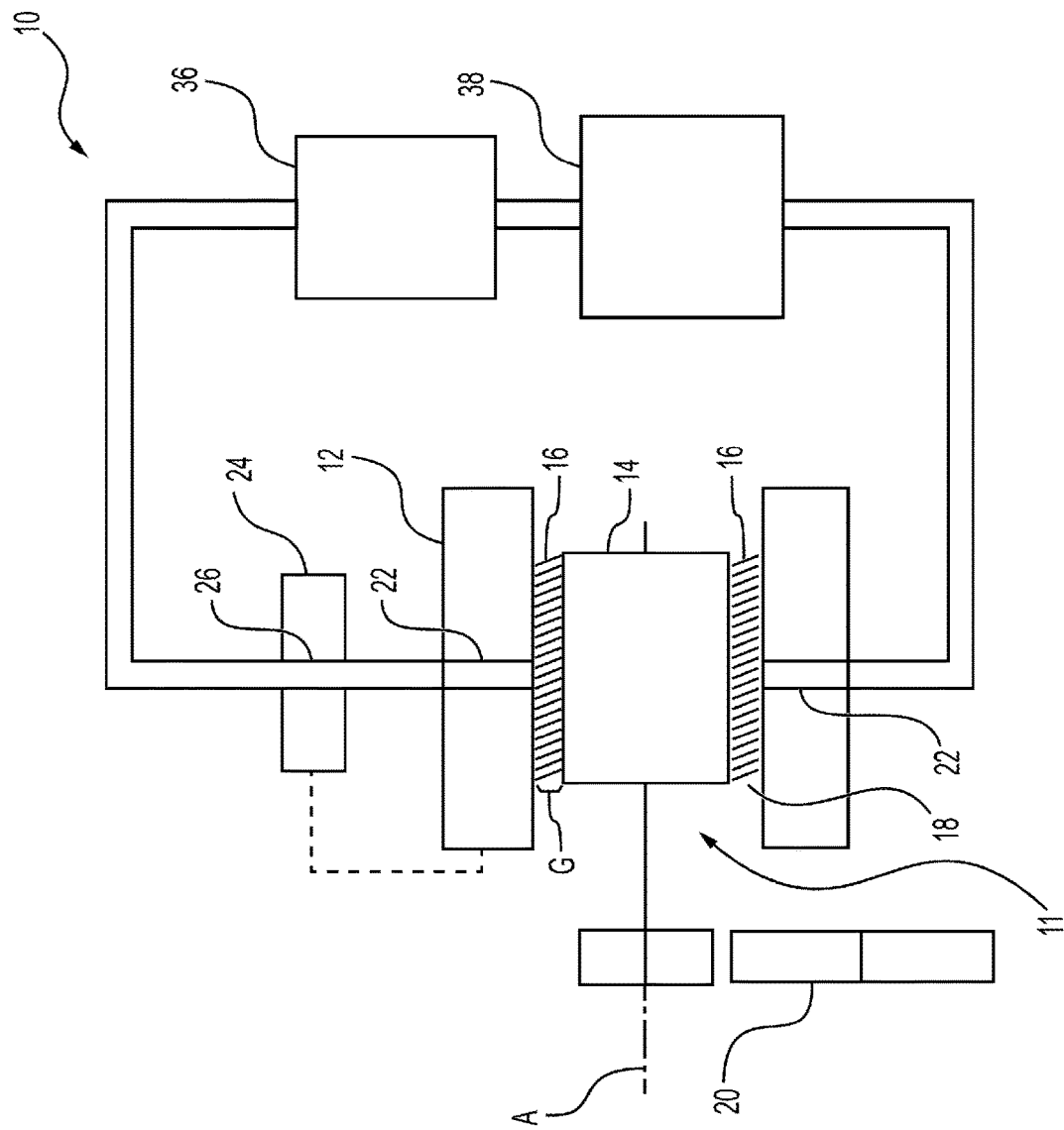
FIG. 1 shows a schematic view of a system including a lubricant-supported electric motor and a liquid-cooled inverter having a shared coolant/lubricant in accordance with an aspect subject disclosure.

FIG. 1 illustrates a common lubrication and cooling system 10 for a lubricant-supported electric motor 11 of the disclosure. As best illustrated in FIG. 1, the lubricant-supported electric motor 11 includes a stator 12 and a rotor 14 extending along an axis A and movably disposed within the stator 12 to define a support chamber 16 or gap G therebetween. Although illustrated and described with the rotor 14 disposed within the stator 12, the arrangement of these components can also be reversed (i.e., with the rotor 14 disposed in surrounding relationship with the stator 12) without departing from the scope of the subject disclosure. A lubricant/coolant fluid 18 is disposed in the support chamber 16 for supporting the rotor 14 within and relative to the stator 12, allowing the rotor 14 to rotate relative to the stator 12 and lubricating and cooling these components. The lubricant/coolant fluid 18 acts as a buffer (e.g., suspension) between the rotor 14 and stator 12 minimizing or preventing contact therebetween. In other words, the lubricant/coolant fluid 18 prevents direct contact between the stator 12 and rotor 14 and provides a lubricant-supported electric motor 11 which is robust to shock and vibration loading due to the presence of the lubricant/coolant fluid 18 in the support chamber 16. Additionally, and alternatively, a lubricant/coolant fluid that is substantially incompressible may be used in order to minimize the gap between the stator 12 and rotor 14.

As further illustrated in FIG. 1, the rotor 14 is interconnected to a drive assembly 20 for coupling the lubricant-supported electric motor 11 to one of the plurality of wheels of a vehicle. For example, in one instance, the drive assembly 20 may include a planetary gear system. Alternatively, the drive assembly 20 may include one or more parallel axis gears. In either arrangement, the lubricant-supported electric motor 11 is arranged in an "on-wheel", "near-wheel" or "in-wheel" motor system in which the lubricant-supported electric motor 11 is disposed proximate to, on, or within the vehicle wheel. Although not expressly illustrated, accordingly to another aspect, the lubricant-supported electric motor 11 can be connected directly to the vehicle wheel, without the use of this drive assembly 20 to establish the "on-wheel", "near-wheel" or "in-wheel" electric motor arrangement. In any arrangement, the stator 12 and rotor 14 are configured to exert an electromagnetic force therebetween to convert electrical energy into mechanical energy, moving the rotor 14 and ultimately driving the wheel coupled to the lubricant-supported electric motor 11. If present, the drive assembly 20 may provide one or more reduction ratios between the lubricant-supported electric motor 11 and the wheel in response to movement of the rotor 14.

As further illustrated FIG. 1, the stator 12 defines a motor passageway 22 disposed in fluid communication with the support chamber 16 for introducing the lubricant/coolant fluid 18. However, the motor passageway 22 could be provided on any other components of the lubricant-supported electric motor 11, without departing from the subject disclosure. A liquid-cooled inverter 24 is disposed in electrical communication with the lubricant-supported electric motor 11 and defines an inverter passageway 26 disposed in fluid communication with the motor passageway 22 for allowing the lubricant/coolant fluid 18 to also pass through the liquid-cooled inverter 24 and over its electronic components. Thus, the lubricant/coolant fluid 18 used to lubricate and cool the lubricant-supported electric motor 11 is also used for cooling the liquid-cooled inverter 24. The lubricant/coolant fluid 18 may be a liquid, such as a dielectric oil having a composition that acts as an electrical insulator, such that the lubricant/coolant fluid 18 will not conduct electricity, making the lubricant/coolant fluid 18 suitable for direct contact with electric components of the liquid-cooled inverter 24. The dielectric oil also has good heat transfer properties, such that it may act well as a coolant for both the lubricant-supported electric motor 11 as well as the liquid-cooled inverter 24. The dielectric oil is also incompressible, making it a good candidate for supporting the rotor 14 relative to the stator 12 in the lubricant-supported electric motor 11. Finally, the dielectric oil also serves as a good lubricant for use within the lubricant-supported electric motor 11. The liquid-cooled inverter 24 includes a number of electric components necessary to convert DC current into AC current, such as switches, transistors, semiconductors and the like.

As illustrated in FIG. 1, the lubricant/coolant fluid 18 is cycled or pumped through both the motor passageway 22 and the inverter passageway 26, and into their respective components, as one continuous fluid communication line. For example, a pump 36 may be fluidly coupled to a sump or reservoir 38 of the lubricant/coolant fluid 18, such that the lubricant/coolant fluid 18 is pumped from the reservoir 38, through the motor passageways 22 and the inverter passageways 26 and into the support chamber 16 of the lubricant-supported electric motor 11. In an alternative arrangement, rotation of the rotor 14 relative to the stator 12 could act as a self-pump to pull the lubricant/coolant fluid 18 through the passageways 22, 26 and into the support chamber 16. Although not expressly illustrated, a further enhancement of the common lubrication and cooling system 10 includes that the reservoir 38 is designed with a low point where water present in the lubricant/coolant fluid 18 could collect. A diagnostic message to a driver of the vehicle could be sent indicating that a drain plug of the reservoir 38 needs to be opened to purge the tank of water.

Figure 2:
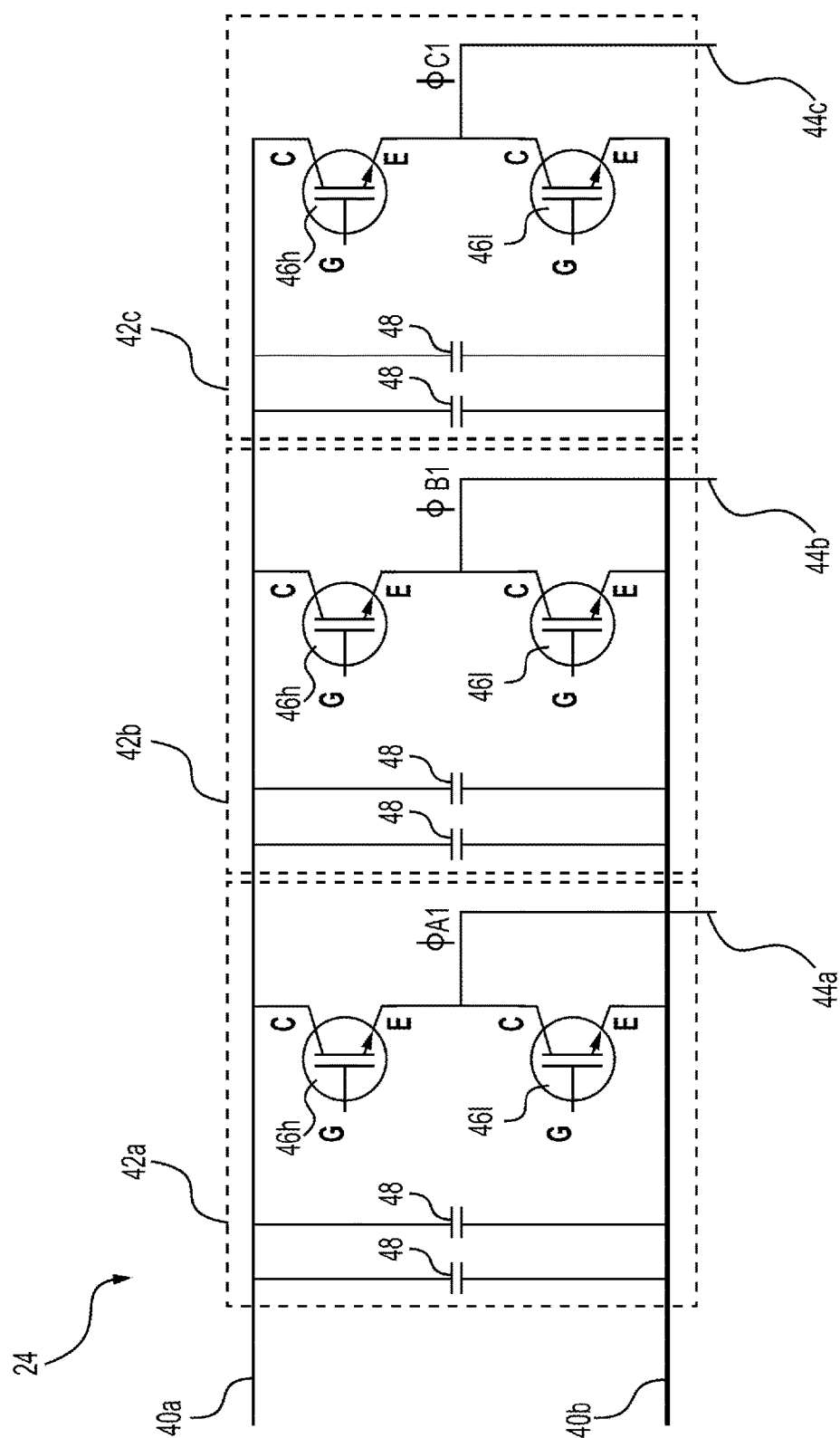
FIG. 2 shows an electrical schematic diagram showing a portion of the liquid-cooled inverter in accordance with an aspect of the present disclosure.

FIG. 2 shows an electrical schematic diagram of a portion of the liquid-cooled inverter 24. The liquid-cooled inverter 24 includes a DC positive conductor 40a and a DC negative conductor 40b having a DC voltage therebetween. The liquid-cooled inverter 24 includes an A-phase driver 42a configured to generate an alternating current (AC) power on an A-phase output conductor 44a for supplying current to a corresponding stator winding of the lubricant-supported electric motor 11. The liquid-cooled inverter 24 also includes a B-phase driver 42b configured to generate AC power on a B-phase output conductor 44b for supplying current to a corresponding stator winding of the lubricant-supported electric motor 11. The liquid-cooled inverter 24 also includes a C-phase driver 42c configured to generate AC power on a C-phase output conductor 44c for supplying current to a corresponding stator winding of the lubricant-supported electric motor 11. Each of the phase drivers 42a, 42b, 42c includes a high-side power switch 46h configured to selectively conduct current between the DC positive conductor 40a and a corresponding one of the output conductors 44a, 44b, 44c. Each of the phase drivers 42a, 42b, 42c also includes a low-side power switch 46l configured to selectively conduct current between the DC negative conductor 40b and a corresponding one of the output conductors 44a, 44b, 44c. Each of the power switches 46h, 46l is shown schematically as a single insulated gate bipolar transistor (IGBT) having a collector terminal C, an emitter terminal E, and a gate terminal G. Each of the power switches 46h, 46l is configured to selectively conduct current between the collector terminal C and the emitter terminal E in response to application of a control voltage to the gate terminal G. Alternatively or additionally, other types of power switching devices, such as field-effect transistors (FETs) or other types of junction devices, may be used for some or all of the power switches 46h, 46l. In some embodiments, one or more of the power switches 46h, 46l may include a parallel-connected combination of two or more discrete devices, such as IGBT devices.

The liquid-cooled inverter 24 is shown as a three-phase device having three of the phase drivers 42a, 42b, 42c. However, the principles of the present disclosure may be implemented in a single-phase device having only one of the phase drivers 42a, 42b, 42c and/or in a multi-phase device having a different number, such as five or nine, of the phase drivers 42a, 42b, 42c.

Each of the phase drivers 42a, 42b, 42c also includes two DC link capacitors 48 connected between the DC positive conductor 40a and the DC negative conductor 40b adjacent to the power switches 46h, 46l to supply relatively large inrush currents to the power switches 46h, 46l and to reduce electromagnetic interference (EMI).

Figure 3:
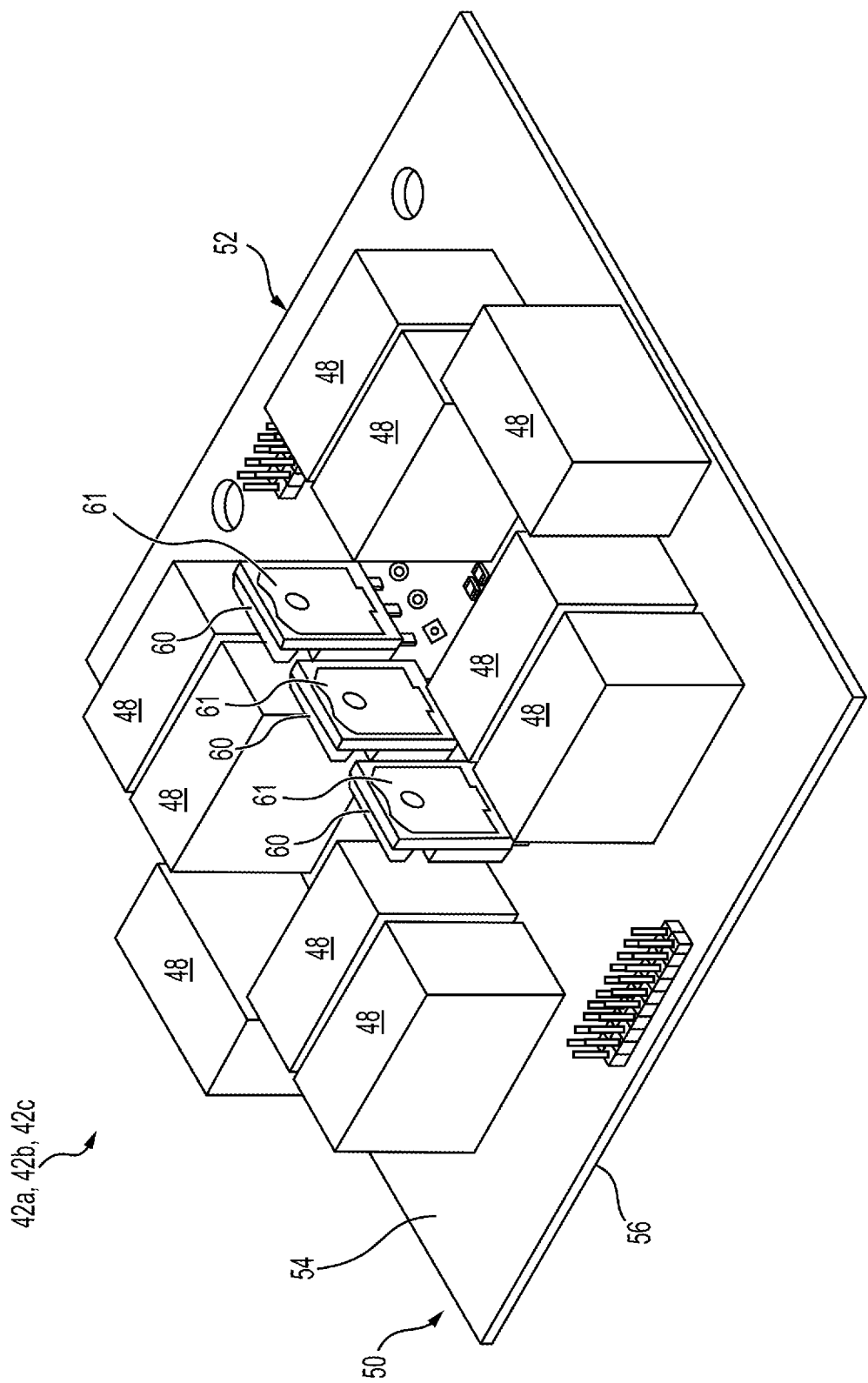
FIG. 3 shows a perspective view of a printed circuit board assembly (PCBA) of the liquid-cooled inverter in accordance with an aspect of the present disclosure.

FIG. 3 illustrates a printed circuit board assembly (PCBA) 50 of the liquid-cooled inverter 24 in accordance with an aspect of the subject disclosure. The PCBA 50 may function as one of the phase drivers 42a, 42b, 42c of the liquid-cooled inverter 24. The PCBA 50 includes a number of electric components necessary to convert DC current into AC current, such as switches, transistors, semiconductors and the like. As shown on FIG. 3, the PCBA 50 includes a printed circuit board (PCB) 52 that defines a first surface 54 and a second surface 56 opposite the first surface 54. The PCBA 50 includes three first switch devices 60 disposed on the first surface 54 of the PCB 52. Each of the first switch devices 60 is a discrete device, such as single insulated gate bipolar transistor (IGBT) device. However, the first switch devices 60 may include other types of discrete electronic devices, such as a field-effect transistor or another type of junction device. Each of the first switch devices 60 includes a conductive tab 61 that is electrically connected to a drain terminal thereof, such as the collector C. The first switch devices 60 extend perpendicularly to the first surface 54 of the PCB 52 and are aligned in-line with one another, with the respective conductive tabs 61 being co-planer with one-another. The first switch devices 60 may be electrically connected in parallel with one-another and together function as the high-side power switch 46h. The PCBA 50 also includes ten (10) of the DC link capacitors 48 disposed on the first surface 54 of the PCB 52. However, the PCBA 50 may include a different number of the DC link capacitors 48.

The PCBA 50 may include three second switch devices 62 disposed on the second surface 56 of the PCB 52 and which are similar or identical to the first switch devices 60. The second switch devices 62 may be arranged in-line with one-another defining a plane that is parallel to and spaced apart from the plane of the first switch devices 60. The second switch devices 62 may be electrically connected in parallel with one-another and together function as the low-side power switch 46l. In some embodiments, one or more additional components, such as a gate driver for supplying control signals to the switch devices 60, 62, may be disposed on the PCB 52 of the PCBA 50.

The liquid-cooled inverter 24 may have a power rating that it can be met with discrete devices, such as a parallel combination of the first switch devices 60 and/or the second switch devices 62, in contrast to a single power module common in inverters configured for higher power levels. Each of the power switches 46h, 46l of the liquid-cooled inverter 24 of the present disclosure includes three discrete switch devices 60, 62 connected in parallel. Consequently, the total number of discrete switch devices 60, 62 for the liquid-cooled inverter 24 is eighteen (i.e. three first switch devices 60 in each high-side power switch 46h and three second switch devices 62 in each low-side power switch 46l for each of three phases a,b,c). Each of the discrete switch devices 60, 62 may require additional cooling surface area to maintain junction temperatures within operating ranges specified by a supplier or manufacturer thereof.

Figure 4:
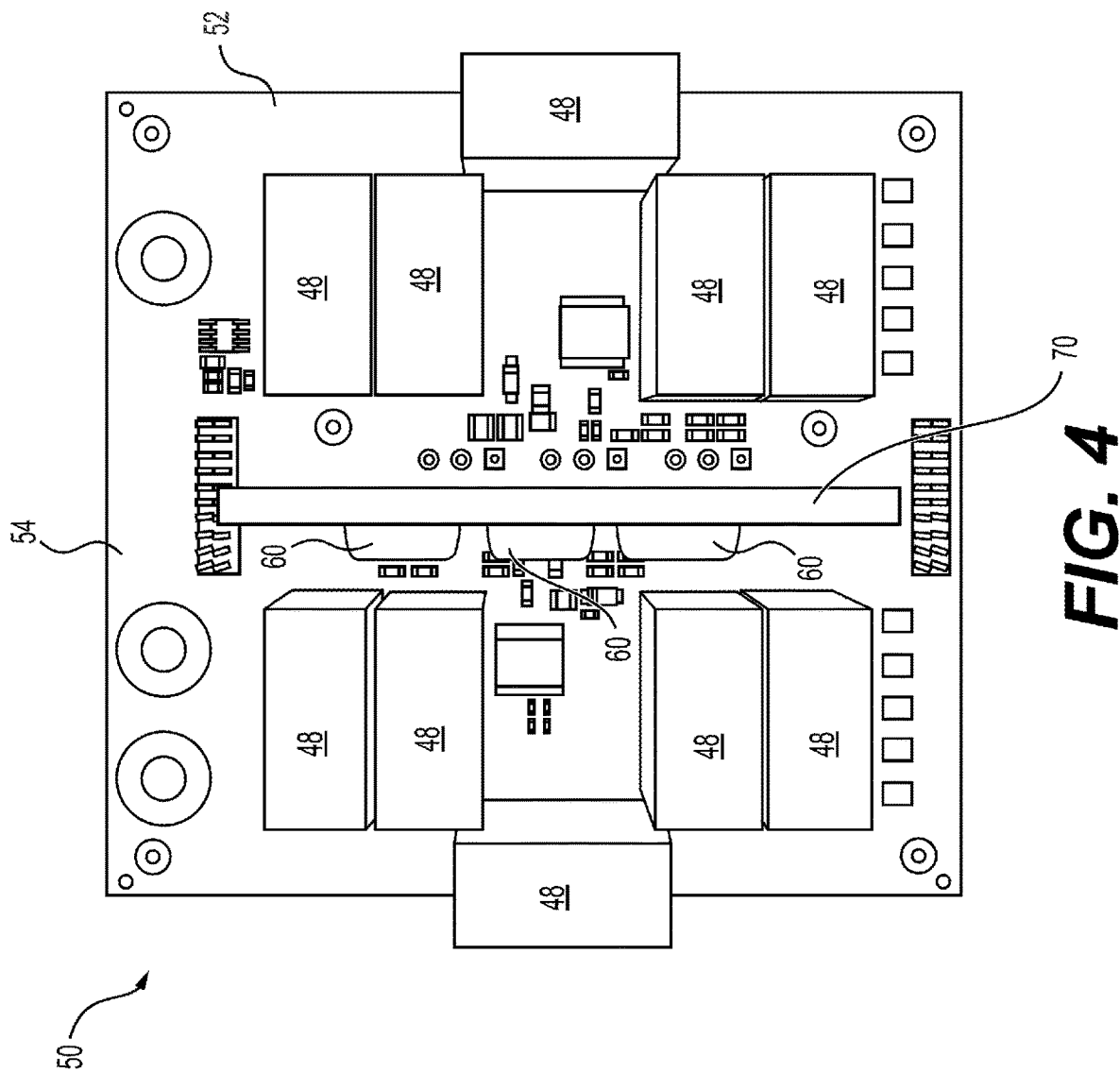
FIG. 4 shows a top view of the PCBA of FIG. 3, with a heat sink.

FIG. 4 shows a top view of the PCBA 50 with a first heatsink 70 connected to the first switch devices 60. The first heatsink 70 may provide rigidity to physically support the first switch devices 60. The first heatsink 70 may be configured to carry electrical current. For example, the first heatsink 70 may include a metal material, such as copper, which may be electrically connected to the conductive tabs 61 of each of the first switch devices 60. The first heatsink 70 may function as a bus bar to distribute electrical current between several of the first switch devices 60. For example, the first heatsink 70 may function as the DC positive conductor 40a. The first heatsink 70 overlies and connects to the conductive tabs 61 of each of the first switch devices 60, thereby reducing electromagnetic interference (EMI) that may be otherwise produced by operation of the first switch devices 60.

Thus, as illustrated in FIG. 4, the liquid-cooled inverter 24 includes at least one first heatsink 70 which is attached to the circuit board to add rigidity and to carry current. The first heatsink 70 may provide thermal dissipation by transmitting heat away from the first switch devices. The first heatsink 70 may also provide structural rigidity against shock and vibration. In accordance with the disclosure, the entire contents of the liquid-cooled inverter 24, including the PCBA 50, may be configured to be immersed in flowing oil, which will cool the heatsink first heatsink 70.

Figure 5:
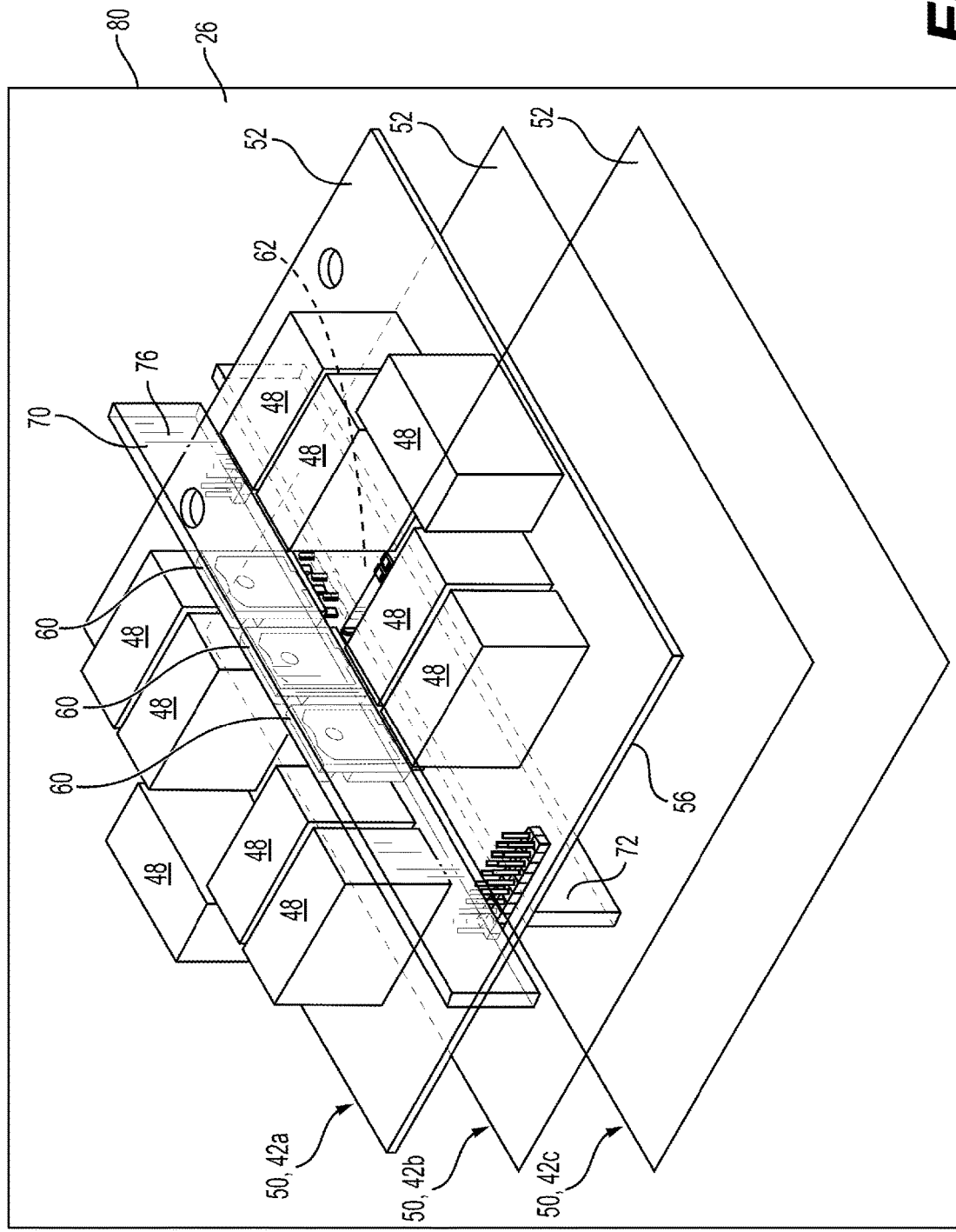
FIG. 5 shows a perspective view of the liquid-cooled inverter, including a stack of three of the PCBAs.

FIG. 5 shows a perspective view of the liquid-cooled inverter 24, including a stack of three of the PCBAs 50, with each of the PCBAs 50 implementing a corresponding one of the phase drivers 42a, 42b, 42c. Only one of the PCBAs 50 associated with the A-phase driver 42a is detailed in FIG. 5. However, each of the PCBAs 50 may have a similar or identical construction. FIG. 5 also shows one of the second switch devices 62 disposed on the second surface 56 of one of the PCBs 52. FIG. 5 also shows a second heatsink 72 that is mechanically connected to the plurality of second switch devices 62 and configured to remove heat therefrom.

In some embodiments, the second switch devices 62 that comprise one or more of the low-side power switches 46l may be electrically isolated from the second heatsink. For example, a sheet of material that is an electrical insulator and a good thermal conductor, such as a ceramic, may be disposed between the conductive tab 61 of one or more of the second switch devices 62 and the second heatsink 72. This may be necessary where the second heatsink 72 is mechanically connected to two or more discrete devices that are not connected in parallel. For example, in a case where the second switch devices 62 are associated the low-side power switches 46l of two or more of the phase drivers 42a, 42b, 42c and are mechanically connected to a same a second heatsink 72. The second heatsink 72 may, therefore, provide mechanical stability to second switch devices 62 and to any other devices attached thereto.

Alternatively, the second heatsink 72 may be electrically connected to the conductive tabs 61 of each of the second switch devices 62 where all of the second switch devices 62 mechanically connected thereto are connected in parallel. The second heatsink 72 may function as a bus bar to distribute electrical current between several of the second switch devices 62. For example, where two or more of the second switch devices 62 are associated with the low-side power switch 46l of a given one of the phase drivers 42a, 42b, 42c, the second heatsink 72 may be electrically connected thereto and function as the corresponding one of the output conductors 44a, 44b, 44c. Thus, in some embodiments, the second heatsink 72 may function as a current carrying conductor.

As shown in FIG. 5, the first heatsink 70 includes fins 76 configured to increase surface area and to facilitate heat transfer to the liquid coolant. The second heatsinks 72 may include similar fins 76. It should be appreciated that the fins 76 may have a different arrangement than what is shown on FIG. 5, such as a different orientation and/or location. In some embodiments, the first heatsinks 70 and/or the second heatsinks 72 may define flow channels (not shown in the FIGS.), and which are configured to transmit the liquid coolant therethrough. Each of the first heatsinks 70 and the second heatsinks 72 may have a design that it is optimized for both heat transfer and for reduction of EMI.

FIG. 5 also shows a rectangle that schematically represents a housing 80 that defines the inverter passageway 26 and which surrounds each of the PCBAs 50 of the liquid-cooled inverter 24. The inverter passageway 26 may be configured as one or more chambers that hold the PCBAs 50 and which conduct a liquid coolant, such as the lubricant/coolant fluid 18, in thermal communication with the first heatsinks 70 with the second heatsinks 72 for removing heat therefrom. The housing 80 may be made of a material, such as resin or metal, that is thermally insulating, and which reduces overall EMI. In some embodiments, the housing 80 may be integrally packaged with the lubricant-supported electric motor 11. In some embodiments, the liquid-cooled inverter 24 may be configured such that the PCBs 52 are oriented vertically when the liquid-cooled inverter 24 is installed for operation, such as in a vehicle. Such vertical orientation may reduce or eliminate foaming in the liquid coolant therein, which could otherwise adversely affect efficiency of heat transfer between the heatsinks 70, 72 and the liquid coolant.

In some embodiments, the housing 80 of the liquid-cooled inverter 24 may include and/or function as the reservoir 38, thereby alleviating need for a separate vessel.

In some embodiments, the liquid-cooled inverter 24 may include a controller board (not shown in the FIGs.), which is disposed on a lid of the housing 80 and which electrically connects with each of the PCBAs 50, e.g. using one or more pin and plug connectors. Such configuration may avoid an additional connector and allow easier replacement/servicing;

In some embodiments, the inverter passageway 26 may be configured to cause the liquid coolant to have a turbulent flow, thereby increasing heat transfer from the first heatsinks 70 and/or the second heatsinks 72 and into the liquid coolant.

In some embodiments, the PCBAs 50 of the liquid-cooled inverter 24 are connected together by one or more structures (not shown in the FIGS), such as stand-offs and/or by mounting tabs integrated in the housing 80, and which maintain spacing between the respective PCBAs 50.

The inverter passageway 26 may be configured to distribute the liquid coolant and to maintain temperatures of the DC link capacitors 48 and the switch devices 60, 62 of the power switches 46h, 46l within predetermined acceptable temperature ranges.

A common lubrication and cooling system includes a lubricant-supported electric motor including a stator and a rotor defining a gap therebetween, with a liquid coolant disposed in the gap for supporting the rotor while allowing the rotor to rotate relative to the stator. The common lubrication and cooling system also includes a liquid-cooled inverter. The liquid-cooled inverter includes a plurality of switch devices configured to supply an alternating current (AC) power to the lubricant-supported electric motor for driving the rotor to rotate. The liquid-cooled inverter also includes a first heatsink mechanically connected to the plurality of switch devices. The liquid-cooled inverter also includes an inverter passageway configured transmit the liquid coolant between the lubricant-supported electric motor and into fluid communication with the first heatsink for transmitting heat away from the first heatsink.

In some embodiments, the common lubrication and cooling system further includes a pump configured to circulate the liquid coolant between the lubricant-supported electric motor and through the inverter passageway of the liquid-cooled inverter.

In some embodiments, the first heatsink is configured to conduct electrical current with the plurality of switch devices mechanically connected thereto.

In some embodiments, the liquid-cooled inverter further comprises a direct current (DC) positive conductor and a DC negative conductor configured to have a DC voltage therebetween. In some embodiments the first heatsink is electrically connected to the DC positive conductor, and each switch device of the plurality of switch devices includes a tab in electrical communication with the first heatsink.

In some embodiments, the liquid-cooled inverter further comprises: a direct current (DC) positive conductor and a DC negative conductor configured to have a DC voltage therebetween, and a phase driver. In some embodiments, the phase driver includes a printed circuit board (PCB), a high-side power switch configured to selectively conduct power between the DC positive conductor and an output conductor, and a low-side power switch configured to selectively conduct power between the DC negative conductor and the output conductor. In some embodiments, at least one of the high-side power switch and the low-side power switch includes the plurality of switch devices being disposed on a first surface of the PCB.

In some embodiments, the high-side power switch comprises the plurality of switch devices. In some embodiments, the liquid-cooled inverter further comprises: the low-side power switch including a plurality of second switch devices disposed on the PCB, and a second heatsink mechanically connected to the plurality of second switch devices and configured to remove heat therefrom.

In some embodiments, the plurality of second switch devices of the low-side power switch are located on a second surface of the PCB opposite from the first surface of the PCB with the plurality of switch devices of the high-side power switch In some embodiments, the plurality of second switch devices of the low-side power switch are electrically isolated from the second heatsink.

In some embodiments, the phase driver is one of a plurality of phase drivers of the liquid-cooled inverter, with each phase driver of the plurality of phase drivers having a similar construction. In some embodiments, the PCBs of the plurality of phase drivers are stacked parallel to and spaced apart from one another.

In some embodiments, the PCB and the first heatsink are submerged in the liquid coolant.

In some embodiments, the plurality of switch devices of the at least one of the high-side power switch and the low-side power switch includes three of the switch devices.

A liquid-cooled inverter includes a direct current (DC) positive conductor and a DC negative conductor configured to have a DC voltage therebetween. The liquid-cooled inverter also includes a phase driver. The phase driver includes a printed circuit board (PCB), a high-side power switch configured to selectively conduct power between the DC positive conductor and an output conductor, and a low-side power switch configured to selectively conduct power between the DC negative conductor and the output conductor. At least one of the high-side power switch and the low-side power switch includes a plurality of switch devices disposed on the PCB. The liquid-cooled inverter also includes a first heatsink mechanically connected to the plurality of switch devices and configured to remove heat therefrom. The liquid-cooled inverter also includes a housing defining an inverter passageway configured to conduct a liquid coolant in thermal communication with the first heatsink for removing heat therefrom.

In some embodiments, the high-side power switch comprises the plurality of switch devices. In some embodiments, the liquid-cooled inverter further comprises: the low-side power switch including a plurality of second switch devices disposed on the PCB, and a second heatsink mechanically connected to the plurality of second switch devices and configured to remove heat therefrom.

In some embodiments, the plurality of switch devices of the high-side power switch are disposed on a first surface of the PCB. In some embodiments, the plurality of second switch devices of the low-side power switch are located on a second surface of the PCB opposite from the first surface of the PCB with the plurality of switch devices of the high-side power switch.

In some embodiments, the plurality of second switch devices of the low-side power switch are electrically isolated from the second heatsink.

In some embodiments, the phase driver is one of a plurality of phase drivers each having a similar construction. In some embodiments, the PCBs of the plurality of phase drivers are stacked parallel to and spaced apart from one another.

In some embodiments, the PCB and the first heatsink are submerged in the liquid coolant.

In some embodiments, the first heatsink is configured to conduct electrical current with the plurality of switch devices mechanically connected thereto.

In some embodiments, the first heatsink is electrically connected to the DC positive conductor. In some embodiments, each switch device of the plurality of switch devices includes a tab in electrical communication with the first heatsink.

In some embodiments, the plurality of switch devices of the at least one of the high-side power switch and the low-side power switch includes three of the switch devices The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A common lubrication and cooling system, comprising:
   a lubricant-supported electric motor including a stator and
      a rotor defining a gap therebetween, with a liquid coolant disposed in the gap for supporting the rotor while allowing the rotor to rotate relative to the stator; and
   a liquid-cooled inverter including:
      a plurality of switch devices configured to supply an alternating current (AC) power to the lubricant-supported electric motor for driving the rotor to rotate;
      a first heatsink mechanically connected to the plurality of switch devices;
      a phase driver including a printed circuit board (PCB); and an inverter passageway configured to transmit the liquid coolant between the lubricant-supported electric motor and into completely submerged relationship with the first heatsink and the PCB for liquid cooling the liquid-cooled inverter.

2. The system of claim 1, further comprising a pump configured to circulate the liquid coolant between the lubricant-supported electric motor and through the inverter passageway of the liquid-cooled inverter.

3. The system of claim 1, wherein the first heatsink is configured to conduct electrical current with the plurality of switch devices mechanically connected thereto.

4. The system of claim 1, wherein the liquid-cooled inverter further comprises a direct current (DC) positive conductor and a DC negative conductor configured to have a DC voltage therebetween;
wherein the first heatsink is electrically connected to the DC positive conductor, and
wherein each switch device of the plurality of switch devices includes a tab in electrical communication with the first heatsink.

5. The system of claim 1, wherein the liquid-cooled inverter further comprises:
a direct current (DC) positive conductor and a DC negative conductor configured to have a DC voltage therebetween; and
the phase driver further including: a high-side power switch configured to selectively conduct power between the DC positive conductor and an output conductor, and a low-side power switch configured to selectively conduct power between the DC negative conductor and the output conductor,
wherein at least one of the high-side power switch and the low-side power switch includes the plurality of switch devices being disposed on a first surface of the PCB.

6. The system of claim 5, wherein the high-side power switch comprises the plurality of switch devices, and wherein the liquid-cooled inverter further comprises:
the low-side power switch including a plurality of second switch devices disposed on the PCB; and
a second heatsink mechanically connected to the plurality of second switch devices and configured to remove heat therefrom.

7. The system of claim 6, wherein the plurality of second switch devices of the low-side power switch are located on a second surface of the PCB opposite from the first surface of the PCB with the plurality of switch devices of the high-side power switch.

8. The system of claim 6, wherein the plurality of second switch devices of the low-side power switch are electrically isolated from the second heatsink.

9. The system of claim 5, wherein the phase driver is one of a plurality of phase drivers of the liquid-cooled inverter, with each phase driver of the plurality of phase drivers having a similar construction; and
wherein the PCBs of the plurality of phase drivers are stacked parallel to and spaced apart from one another.

10. The system of claim 5, wherein the plurality of switch devices of the at least one of the high-side power switch and the low-side power switch includes three of the switch devices.

11. A liquid-cooled inverter, comprising:
a direct current (DC) positive conductor and a DC negative conductor configured to have a DC voltage therebetween;
a phase driver including: a printed circuit board (PCB), a high-side power switch configured to selectively conduct power between the DC positive conductor and an output conductor, and a low-side power switch configured to selectively conduct power between the DC negative conductor and the output conductor, and wherein at least one of the high-side power switch and the low-side power switch includes a plurality of switch devices disposed on the PCB;
a first heatsink mechanically connected to the plurality of switch devices and configured to remove heat therefrom; and
a housing defining an inverter passageway configured to conduct a liquid coolant into completely submerged relationship with the first heatsink and the PCB for liquid cooling the liquid cooled inverter.

12. The liquid-cooled inverter of claim 11, wherein the high-side power switch comprises the plurality of switch devices, and wherein the liquid-cooled inverter further comprises:
the low-side power switch including a plurality of second switch devices disposed on the PCB; and
a second heatsink mechanically connected to the plurality of second switch devices and configured to remove heat therefrom.

13. The liquid-cooled inverter of claim 12, wherein the plurality of switch devices of the high-side power switch are disposed on a first surface of the PCB; and
wherein the plurality of second switch devices of the low-side power switch are located on a second surface of the PCB opposite from the first surface of the PCB with the plurality of switch devices of the high-side power switch.

14. The liquid-cooled inverter of claim 12, wherein the plurality of second switch devices of the low-side power switch are electrically isolated from the second heatsink.

15. The liquid-cooled inverter of claim 11, wherein the phase driver is one of a plurality of phase drivers each having a similar construction; and
wherein the PCBs of the plurality of phase drivers are stacked parallel to and spaced apart from one another.

16. The liquid-cooled inverter of claim 11, wherein the first heatsink is configured to conduct electrical current with the plurality of switch devices mechanically connected thereto.

17. The liquid-cooled inverter of claim 16, wherein the first heatsink is electrically connected to the DC positive conductor, and
wherein each switch device of the plurality of switch devices includes a tab in electrical communication with the first heatsink.

18. The liquid-cooled inverter of claim 11, wherein the plurality of switch devices of the at least one of the high-side power switch and the low-side power switch includes three of the switch devices.

* * * * *